(12) United States Patent
Sasaki et al.

(10) Patent No.: US 8,324,672 B2
(45) Date of Patent: Dec. 4, 2012

(54) SPIN TRANSPORT DEVICE

(75) Inventors: Tomoyuki Sasaki, Tokyo (JP); Tohru Oikawa, Tokyo (JP); Katsumichi Tagami, Saku (JP)

(73) Assignee: TDK Corporation, Tokyo (JP)

( * ) Notice: Subject to any disclaimer, the term of this patent is extended or adjusted under 35 U.S.C. 154(b) by 241 days.

(21) Appl. No.: 12/821,466

(22) Filed: Jun. 23, 2010

(65) Prior Publication Data

US 2010/0327333 A1  Dec. 30, 2010

(30) Foreign Application Priority Data

Jun. 26, 2009 (JP) ............................... P2009-152393

(51) Int. Cl.
H01L 29/76 (2006.01)
H01L 29/94 (2006.01)
H01L 31/062 (2012.01)
H01L 31/113 (2006.01)
H01L 31/119 (2006.01)

(52) U.S. Cl. .......................................... 257/295; 438/3
(58) Field of Classification Search .................. 257/295; 438/3

See application file for complete search history.

(56) References Cited

U.S. PATENT DOCUMENTS

| | | | | |
|---|---|---|---|---|
| 6,643,168 B2 * | 11/2003 | Okazawa | ....................... | 365/173 |
| 6,916,669 B2 * | 7/2005 | Jones et al. | ......................... | 438/3 |
| 7,342,244 B2 * | 3/2008 | Kaushal et al. | ................... | 257/24 |
| 7,535,757 B2 * | 5/2009 | Koga | ............................. | 365/171 |
| 7,602,636 B2 * | 10/2009 | Saito et al. | ....................... | 365/158 |
| 2008/0217711 A1 * | 9/2008 | Sugiyama et al. | ............ | 257/421 |

FOREIGN PATENT DOCUMENTS

| | | |
|---|---|---|
| JP | A-2004-342241 | 12/2004 |
| JP | B2-4029772 | 10/2007 |
| JP | A-2007-299467 | 11/2007 |

OTHER PUBLICATIONS

T. Sasaki et al., "Electrical Spin Injection into Silicon Using MgO Tunnel Barrier," Applied Physics Express 2, The Japan Society of Applied Physics, May 15, 2009, pp. 053003-1 to 053003-3.
O. M. J. Van'T Erve et al., "Electrical injection and detection of spin-polarized carriers in silicon in a lateral transport geometry", Applied Physics Letters, Nov. 21, 2007, pp. 212109-1-212109-3, vol. 91.
T. Kimura et al., "Effect of probe configuration on spin accumulation in lateral spin-valve structure", Journal of Magnetism and Magnetic Materials, Oct. 18, 2004, pp. 88-90, vol. 286.

* cited by examiner

Primary Examiner — Phuc Dang
(74) Attorney, Agent, or Firm — Oliff & Berridge, PLC

(57) ABSTRACT

A spin transport device which comprises a channel, first and second insulating layers, a magnetization fixed layer, a magnetization free layer, first and second wirings, and satisfies at least one of following conditions A and B, Condition A: The first wiring includes a vertical portion which extends in a thickness direction of the magnetization fixed layer on the magnetization fixed layer, and a horizontal portion which extends from the vertical portion that is apart from the magnetization fixed layer side in a direction crossing the thickness direction of the magnetization fixed layer, and Condition B: The second wiring includes a vertical portion which extends in a thickness direction of the magnetization free layer on the magnetization free layer, and a horizontal portion which extends from the vertical portion that is apart from the magnetization free layer side in a direction crossing the thickness direction of the magnetization free layer.

8 Claims, 6 Drawing Sheets

SPIN TRANSPORT DEVICE

BACKGROUND OF THE INVENTION

1. Field of the Invention

The present invention relates to a spin transport device.

2. Related Background Art

A spin transport device, in which a magnetization free layer and a magnetization fixed layer are provided on a channel for accumulating or transporting spin, is known. Recently, a spin transport device in which a semiconductor material is used for a channel is attracting a lot of attention instead of a spin transport device in which a metal material is used for a channel (for example, see Japanese Unexamined Patent Application Publication No. 2007-299467 and Japanese Patent No. 4029772). The spin transport device in which the semiconductor material is used for the channel has the characteristics that a spin diffusion length is long and a spin output is large in comparison to the spin transport device in which the metal material is used for the channel.

SUMMARY OF THE INVENTION

However, in the spin transport device in the related art, noise can not be sufficiently reduced. Accordingly, one object of the present invention is to provide a spin transport device which can sufficiently suppress noise.

Upon examination by the inventors, the following fact has been found out. That is, a big primary cause of noise of the spin transport device is a parasitic voltage. Also, it has been found that if a potential difference in a direction (hereinafter referred to as a "first direction"), which is orthogonal to a direction in which a magnetization fixed layer and a magnetization free layer are connected (a direction of spin flow) and is in parallel to the magnetization fixed layer or the magnetization free layer, occurs in a channel just below the magnetization fixed layer or the magnetization free layer that is to be the electron injection side, the noise due to the parasitic voltage becomes greater. Also, the potential difference in a first direction of the channel is mainly caused by the potential difference in the first direction inside a wiring that is connected to the magnetization fixed layer or the magnetization free layer that is to be the electron injection side.

According to an aspect of the present invention, there is provided a spin transport device, which includes a channel made of a semiconductor material; a magnetization fixed layer arranged on the channel via a first insulating layer; a magnetization free layer arranged on the channel via a second insulating layer; a first wiring electrically connected to the magnetization fixed layer; and a second wiring electrically connected to the magnetization free layer. Also, the spin transport device satisfies at least one of condition A and condition B as follows.

Condition A: The first wiring includes a vertical portion which extends in a thickness direction of the magnetization fixed layer on the magnetization fixed layer, and a horizontal portion which extends from the vertical portion that is apart from the magnetization fixed layer side in a direction crossing the thickness direction of the magnetization fixed layer; and Condition B: The second wiring includes a vertical portion which extends in a thickness direction of the magnetization free layer on the magnetization free layer, and a horizontal portion which extends from the vertical portion that is apart from the magnetization free layer side in a direction crossing the thickness direction of the magnetization free layer.

According to the present invention, the first wiring or the second wiring has the vertical portion, and in this vertical portion, the uniform electric potential distribution is facilitated in the first direction, which is orthogonal to the direction in which the magnetization fixed layer and the magnetization free layer are connected and is in parallel to the magnetization fixed layer or the magnetization free layer. Accordingly, when electrons are supplied from this vertical portion to the magnetization fixed layer or the magnetization free layer, the occurrence of the potential difference in the first direction on the magnetization fixed layer or the magnetization free layer can be suppressed. Thereby, since the potential difference in the first direction in the channel just below the magnetization fixed layer or the magnetization free layer is suppressed, the parasitic voltage of the spin transport device can be lowered and the noise can be reduced.

Here, it is preferable that both the condition A and the condition B are satisfied. According to this, preferably, electron injection from any one of the first wiring and the second wiring can be appropriately performed.

Also, it is preferable that the spin transport device further comprises a first electrode and a second electrode arranged on the channel, wherein the channel extends in a specified direction, and the first electrode, the magnetization fixed layer, the magnetization free layer, and the second electrode are arranged on the channel in order along the specified direction. In the spin transport device having a so-called fine-wire type channel as described above, noise occurs easily due to the occurrence of the potential difference within the channel especially in the direction that is orthogonal to the specified direction (spin flow direction), that is, in the first direction, whereas in the present invention, the noise can be effectively suppressed.

Also, it is preferable that the spin transport device further comprises an insulating layer that covers the channel. Accordingly, unintended spin leakage from the channel to the outside can be suppressed. It is preferable that a material of the insulating layer is an oxide such as SiOx.

Also, it is preferable that the first and second insulating layers are made of magnesium oxide. By using magnesium oxide in the first and second insulating layers, the spin injection efficiency is improved.

Also, it is preferable that a material of the magnetization free layer and the magnetization fixed layer is a metal selected from a group consisting of Ti, V, Cr, Mn, Co, Fe, and Ni, an alloy including one or more elements of the corresponding group, or an alloy including one or more elements selected from the group and one or more elements selected from a group consisting of B, C, and N. Since these materials are soft magnetic materials, it is possible to appropriately realize the function as the magnetization free layer. Also, since these materials are ferromagnetic materials having a high spin polarization rate, it is possible to appropriately realize the function as the magnetization fixed layer.

Also, it is preferable that the magnetization free layer and the magnetization fixed layer have a difference in coercive field due to shape anisotropy. Accordingly, it is possible to omit an antiferromagnetic layer for producing the difference in coercive field.

Also, it is preferable that the coercive field of the magnetization fixed layer is greater than the coercive field of the magnetization free layer. Accordingly, it is possible to appropriately realize the functions of the magnetization fixed layer and the magnetization free layer in the spin transport device.

Also, it is preferable that the spin transport device further comprises an antiferromagnetic layer formed on the magnetization fixed layer, wherein the magnetization direction of the magnetization fixed layer is pinned by the antiferromagnetic layer. As the antiferromagnetic layer is exchange-coupled to the magnetization fixed layer, it is possible to give an one-direction anisotropy in the magnetization direction of the magnetization fixed layer. In this case, the magnetization fixed layer having a high coercive field in one direction can be obtained in comparison to a case where the antiferromagnetic layer is not provided.

According to the present invention, a spin transport device that can sufficiently suppress the noise can be provided.

DESCRIPTION OF THE PREFERRED EMBODIMENTS

Figure 1:
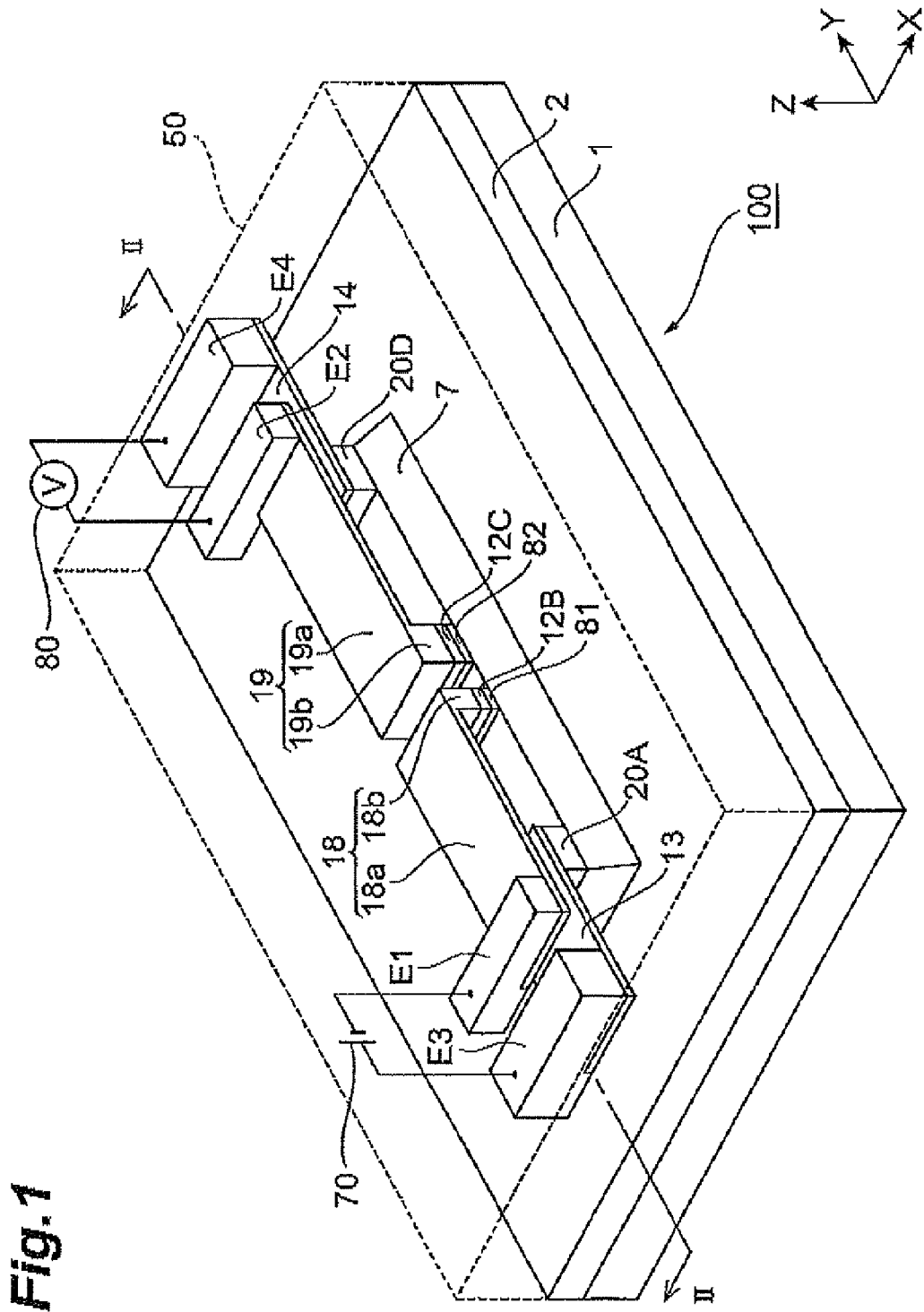
FIG. 1 is a perspective view illustrating a spin transport device according to a first embodiment of the invention.

Hereinafter, preferred embodiments of the present invention will be described in detail with reference to the accompanying drawings. In explaining the drawings, the same reference numerals are given to the same elements, and the duplicate explanation thereof will be omitted.

First Embodiment

Figure 2:
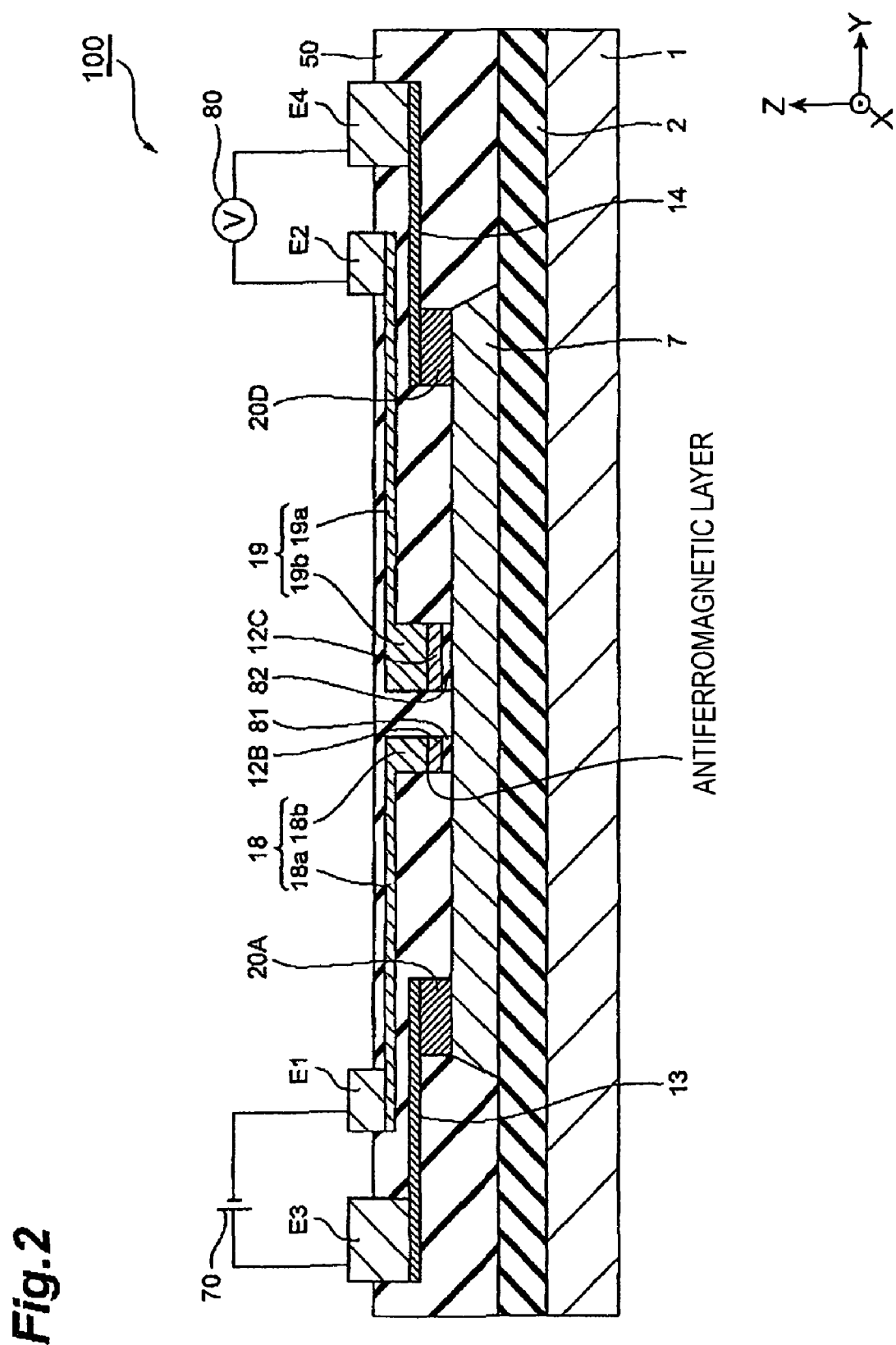
FIG. 2 is a sectional view taken along line II-II in FIG. 1.

With reference to FIGS. 1 and 2, a spin transport device 100 according to a first embodiment of the invention will be described. FIG. 1 is a perspective view illustrating a spin transport device 100, and FIG. 2 is a sectional view taken along line II-II in FIG. 1.

As illustrated in FIG. 1, a spin transport device 100 mainly comprises a silicon substrate 1, an insulating layer 2, a silicon channel 7, a first insulating layer 81, a second insulating layer 82, a magnetization fixed layer 12B, a magnetization free layer 12C, a first electrode 20A, a second electrode 20D, a first wiring 18, and a second wiring 19.

On the silicon substrate 1, the insulating layer 2 and the silicon channel 7 are provided in order. As the insulating layer 2, for example, a silicon oxide or a silicon nitride can be used. As the silicon substrate 1, the insulating layer 2, and the silicon channel 7, an SOI (Silicon On Insulator) substrate can be used.

The silicon channel 7 serves as a layer to which the spin is transported and diffused. The silicon channel 7 comprises silicon, and if necessary, a predetermined doping is performed to control the conductivity. The silicon channel 7 extends in a Y-axis direction, and for example, is in the shape of an island, a rectangular parallelepiped, or a fine wire with its long axes laid on the Y-axis. It is preferable that the width of an upper surface of the silicon channel 7 in an X direction is 1 to 100%.

As illustrated in FIG. 1, the silicon channel 7 has a tilt portion on the side surface thereof, and its tilt angle θ is 50° to 60°. Here, the tilt angle θ is an angle between a bottom portion and a side surface of the silicon channel 7. In this case, the silicon channel 7 can be formed by wet etching, and it is preferable that an upper surface of the silicon channel 7 is the (100) surface.

Also, the first electrode 20A, the magnetization fixed layer 12B, the magnetization free layer 12C, and the second electrode 20D are arranged in order on the silicon channel 7 along the Y-axis direction. That is, the first electrode 20A and the second electrode 20D are arranged on both outsides of the magnetization fixed layer 12B and the magnetization free layer 12C.

As the first electrode 20A and the second electrode 20D, for example, non-magnetic metal having a low-resistance to Si, such as Al, can be used.

The first and second insulating layers 81 and 82 are insulating layers for revealing a tunnel magnetic resistance effect. The first and second insulating layers 81 and 82 are provided on and in contact with the silicon channel 7.

From the view point of suppressing the resistance increase and functioning as a tunnel insulating layer, it is preferable that the layer thickness of the first insulating layer 81 and the second insulating layer 82 is equal to or smaller than 3 nm. Also, it is preferable that in consideration of the thickness of a monatomic layer, the layer thickness of the first insulating layer 81 and the second insulating layer 82 is equal to or larger than 0.4 nm. As a material of the first insulating layer 81 and the second insulating layer 82, for example, magnesium oxide can be used. By using magnesium oxide for the first insulating layer 81 and the second insulating layer 82, the spin injection efficiency is improved.

The magnetization fixed layer 12B is provided on the silicon channel 7 via the first insulating layer 81, and the magnetization free layer 12C is provided on the silicon channel 7 via the second insulating layer 82.

The magnetization fixed layer 12B and the magnetization free layer 12C made of a ferromagnetic material. The material of the magnetization fixed layer 12B and the magnetization free layer 12C can be a metal selected from a group consisting of Ti, V, Cr, Mn, Co, Fe, and Ni, an alloy including one or more elements of the corresponding group, or an alloy including one or more elements selected from the group and one or more elements selected from a group consisting of B, C, and N. Since these materials are soft magnetic materials, it is possible to appropriately realize the function as the magnetization free layer 12C. Also, since these materials are ferromagnetic materials having a high spin polarization rate, it is possible to appropriately realize the function as the magnetization fixed layer 12B.

The magnetization fixed layer 12B and the magnetization free layer 12C are in the shape of a rectangular parallelepiped with their long axes laid on the X-axis. The width of the magnetization free layer 12C in the Y direction is larger than the width of the magnetization fixed layer 12B in the Y direction. The magnetization fixed layer 12B and the magnetization free layer 12C have a difference of a reverse magnetic field due to a difference of an aspect ratios in the X and Y directions. As described above, the magnetization fixed layer 12B and the magnetization free layer 12C have a difference in coercive field due to shape anisotropy, and the coercive field of the magnetization fixed layer 12B is greater than the coercive field of the magnetization free layer 12C.

The first wiring 18 is a wiring that is electrically connected to an electrode pad E1 and the magnetization fixed layer 12B. The first wiring 18 has a vertical portion 18b which extends in a thickness direction (a Z direction) of the magnetization fixed layer 12B on the magnetization fixed layer 12B, and a horizontal portion 18a which extends from the vertical portion 18b that is apart from the magnetization fixed layer side 12B in a direction (−Y direction) crossing the thickness direction (the Z direction) of the magnetization fixed layer 12B, i.e. along the silicon channel 7. The tip end of the horizontal portion 18a extends to a region that is not opposite to the silicon channel 7, and is connected to the electrode pad E1. The width of the first wiring 18 in the X direction is equal to the width of the magnetization fixed layer 12B in the X direction.

The second wiring 19 is a wiring that is electrically connected to an electrode pad E2 and the magnetization free layer 12C. The second wiring 19 has a vertical portion 19b which extends in a thickness direction (the Z direction) of the magnetization free layer 12C on the magnetization free layer 12C, and a horizontal portion 19a which extends from the vertical portion 19b that is apart from the magnetization free layer side 12C in a direction (+Y direction) crossing the thickness direction (the Z direction) of the magnetization free layer 12C, i.e. along the silicon channel 7. The tip end of the horizontal portion 19a extends to a region that is not opposite to the silicon channel 7, and is connected to the electrode pad E2. The width of the second wiring 19 in the X direction is equal to the width of the magnetization free layer 12C in the X direction.

The thickness of the vertical portions 18b and 19b in the Z direction is not specifically designated, but it is preferable that it is about 100 to 1000 nm. Also, the thickness of the horizontal portions 18a and 19a in the Z direction is not specifically designated, but it is preferable that it is about 10 to 50 nm.

Also, the vertical portions 18b and 19b are formed to cover the whole upper surface of the magnetization fixed layer 12B and the magnetization free layer 12C.

A third wiring 13 is a wiring that is electrically connected to an electrode pad E3 and the first electrode 20A, and extends along the silicon channel 7. A fourth wiring 14 is a wiring that is electrically connected to an electrode pad E4 and the second electrode 20D, and extends along the silicon channel 7. The electrode pad E3, electrode pad E1, electrode pad E2, and electrode pad E4 are provided in this order in the Y direction.

The first wiring 18, the second wiring 19, the third wiring 13, and the fourth wiring 14 are made of, for example, a conductive material such as Cu, CuAu, Ag, Al, Au, CuBe, and the like. It is preferable that the vertical portions 18a and 18b are formed of the same material. The electrode pads E1 to E4 are made of a conductive material such as Au, and as illustrated in FIG. 2, are exposed from the insulating layer 50.

In the silicon channel 7, the magnetization fixed layer 12B, and the magnetization free layer 12C, an exposed portion that is not covered by the first electrode 20A, the second electrode 20D, the insulating layers 81 and 82, and the vertical portions 18b and 19b is covered by an insulating layer 50. Accordingly, leakage of the spin flow from the inside of the silicon channel 7 to the outside of the silicon channel 7 can be suppressed. The insulating layer 50 is made of an insulating material, for example, an oxide layer such as silicon oxide, or a nitride layer such as silicon nitride. The silicon oxide is appropriate as a protection layer. Also, the silicon oxide layer can be easily made on the silicon channel 7 comprising silicon.

Hereinafter, the operation of the spin transport device 100 will be described. As illustrated in FIGS. 1 and 2, the electrode pads E1 and E3 are connected to the current source 70, and electrons are supplied from the magnetization fixed layer 12B to the silicon channel 7. While the electrons flow from the magnetization fixed layer 12B that is made of a ferromagnetic material to the non-magnetic silicon channel 7 through the insulating layer 81, electrons having spin whose direction corresponds to the magnetization direction of the magnetization fixed layer 12B are injected into the silicon channel 7. The injected spin is diffused toward the magnetization free layer 12C side. As described above, the spin flow through the silicon channel 7 is mainly made in the Y direction. Also, by a mutual reaction of an electron spin in a magnetization direction of the magnetization free layer 12C that is changed due to an external magnetic field and an electron spin in a portion that is in contact with the magnetization free layer 12C of the silicon channel 7, a voltage output occurs between the silicon channel 7 and the magnetization free layer 12C. This voltage output can be detected by the voltmeter 80 connected to the electrode pads E2 and E4.

The effect of the spin transport device 100 according to the first embodiment will be described. According to the spin transport device 100 according to the first embodiment, the first wiring 18, which is the electron injection side, has the vertical portion 18b, and in this vertical portion 18b, uniform electric potential distribution in the first direction which is orthogonal to the direction (the Y direction) in which the magnetization fixed layer 12B and the magnetization free layer 12C are connected and which is parallel to the magnetization fixed layer 12B and the magnetization free layer 12C, i.e. in the X direction, is facilitated. Accordingly, when electrons are supplied from the vertical portion 18b to the magnetization fixed layer 12B, the occurrence of the potential difference in the X direction in the magnetization fixed layer 12B can be suppressed, and the potential difference in the first direction in the silicon channel 7 that is just below the magnetization fixed layer 12B can be suppressed. Accordingly, the parasitic voltage of the spin transport device 100 can be lowered, and the noise can be reduced. Also, an S/N ratio is improved, and thus higher-accuracy magnetic field detection becomes possible. Further the MR ratio can be improved.

Although the spin transport device according to the first embodiment has been described, the present invention is not limited thereto.

Second Embodiment

Figure 3:
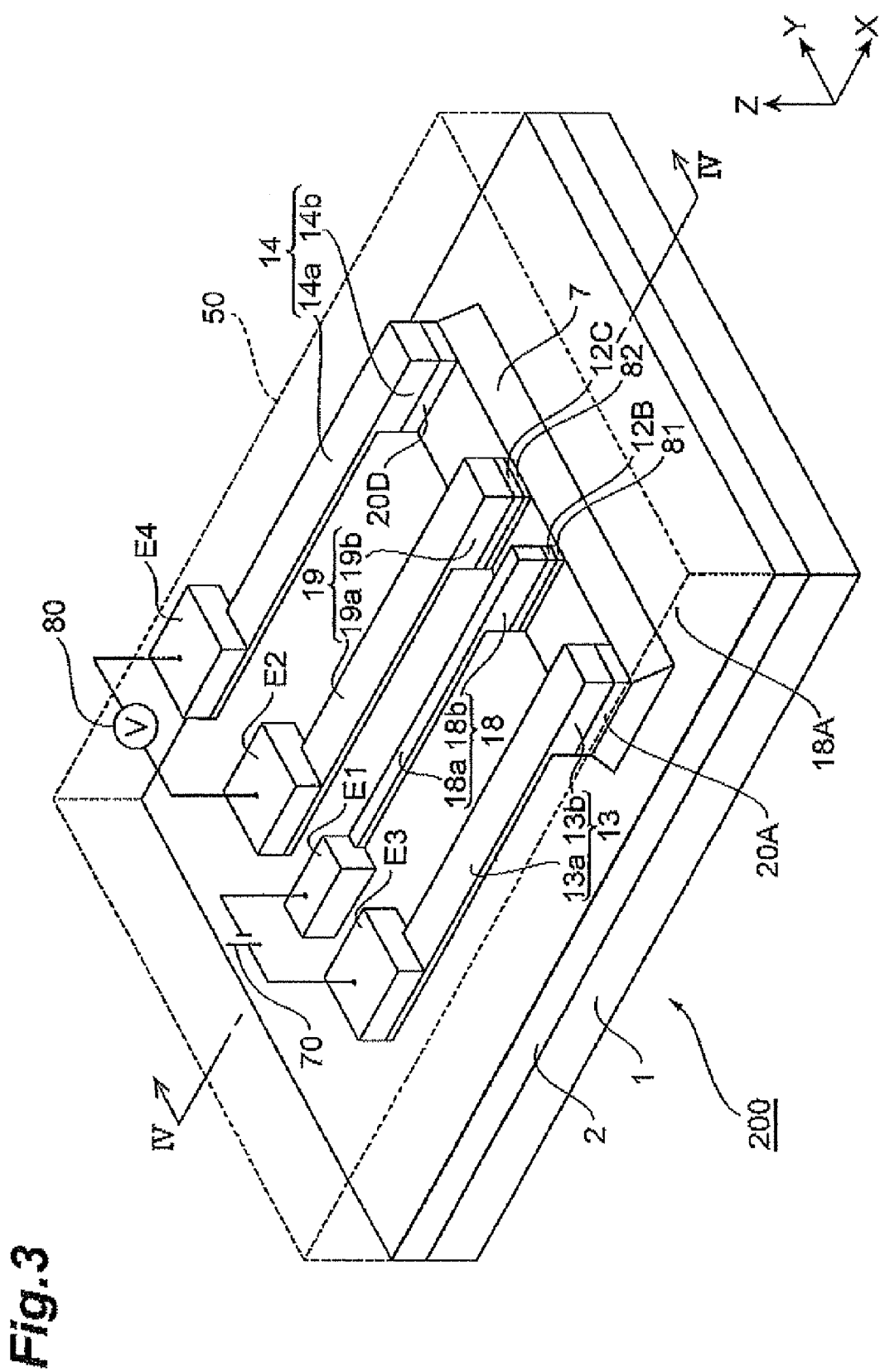
FIG. 3 is a perspective view illustrating a spin transport device according to a second embodiment of the present invention.
Figure 4:
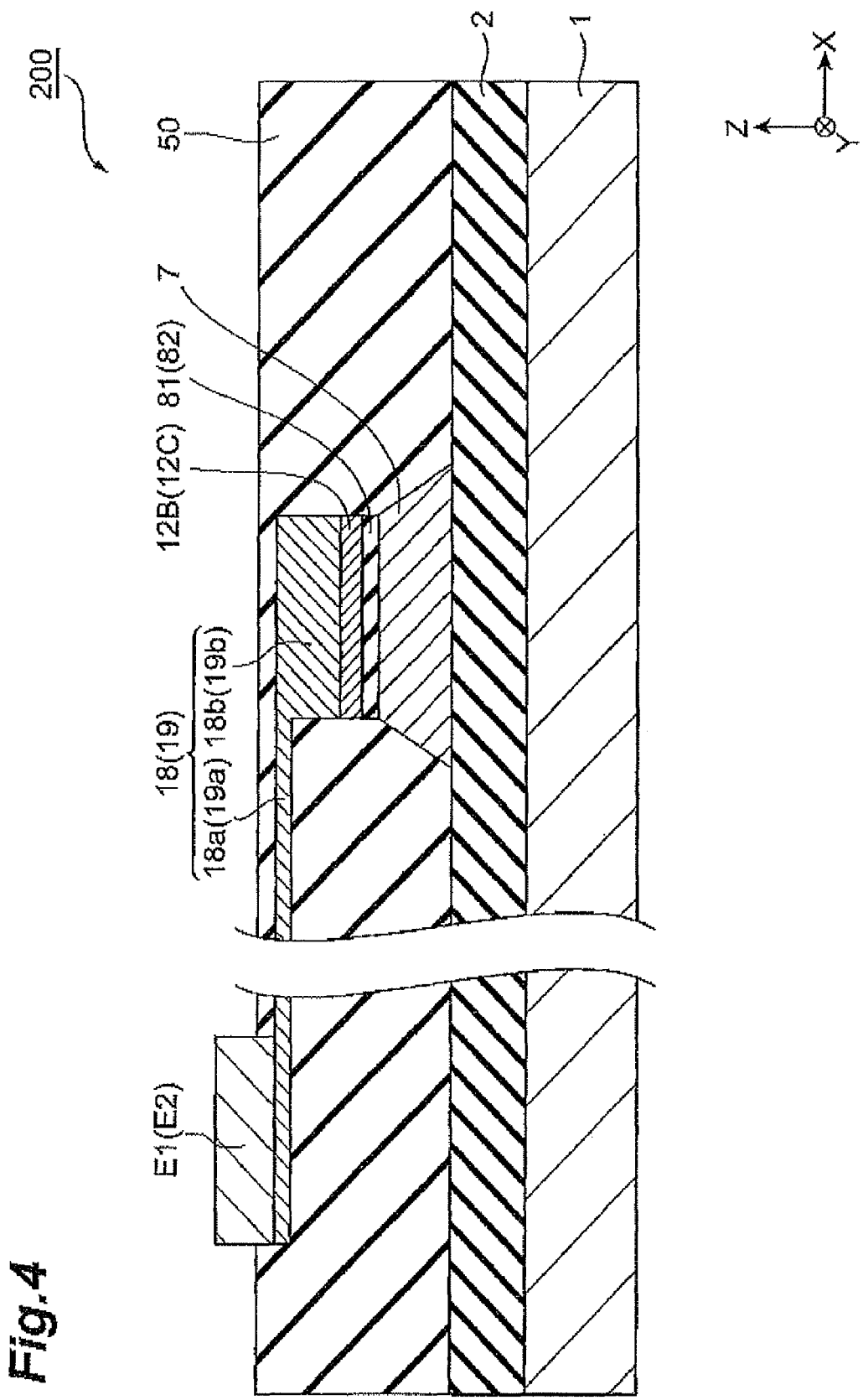
FIG. 4 is a sectional view taken along line IV-IV in FIG. 3.

With reference to FIGS. 3 and 4, a spin transport device 200 according to a second embodiment of the invention will be described. FIG. 3 is a perspective view illustrating a spin transport device 200 according to the second embodiment, and FIG. 4 is a sectional view taken along line IV-IV in FIG. 3.

According to the second embodiment of the invention, unlike the first embodiment, the horizontal portions 18a and 19a of the first wiring 18 and the second wiring 19 are not extend in a direction (the Y direction) along the silicon channel 7, but extend in the X direction. Also, in the same manner as the first wiring 18 and the second wiring 19, the third wiring 13 has a vertical portion 13b and a horizontal portion 13a, and the fourth wiring 14 has a vertical portion 14b and a horizontal portion 14a. The horizontal portion 13a and the horizontal portion 14a extend in the X direction.

Even in this embodiment, the same influence and effect as that in the first embodiment is obtained due to the existence of the vertical portion 18b.

Although the first and second embodiments of the invention have been described, the present invention is not limited thereto. For example, although the extending direction of the horizontal portion 18a in the first embodiment is in parallel to the extending direction of the silicon channel 7, and the extending direction of the horizontal portion 18a in the second embodiment is orthogonal to the extending direction of the silicon channel 7, it is sufficient if the extending direction of the horizontal portion crosses the Z direction that is the thickness direction, for example, the extending direction is a tilt direction. Also, the length of the wirings is not specifically designated.

Although electrons are injected from the magnetization fixed layer 12B in the first and second embodiments, the electrons can be injected from the magnetization free layer 12C to the silicon channel 7 by replacement of the current source 70 and the voltmeter 80. In this case, due to the existence of the vertical portion 19b of the second wiring 19, the same effect is obtained. Also, in the first and second embodiments, the respective vertical portions 18b and 19b are provided on both sides of the first wiring 18 and the second wiring 19, respectively. However, it is needless to say that the vertical portion can be provided on one wiring side only, into which the electrons are injected, that is, the present invention can be enabled with only either of the vertical portion 18b and the vertical portion 19b.

Also, although in the first and second embodiments, it is exemplified that a channel comprising silicon is used as the channel, it is sufficient if the channel made of a semiconductor material. For example, as a channel made of a semiconductor material, a compound semiconductor such as GaAs, a carbon-series material, or the like, can be used.

Although in the embodiment of the invention, a fine-wire type silicon channel is exemplified, the shape of the silicon channel is not specifically designated, and it is sufficient if the silicon channel has a flat shape of which the aspect ratio is almost "1" from the viewpoint from a plane. The present invention can be enabled even if the first electrode 20A, the magnetization fixed layer 12B, the magnetization free layer 12C, and the second electrode 20D are not arranged in line.

Also, instead of producing a difference in coercive field due to the shape anisotropy in the magnetization fixed layer 12B and the magnetization free layer 12C, for example, an antiferromagnetic layer can be further provided on the magnetization fixed layer 12B between the vertical portion 18b and the magnetization fixed layer 12B. The antiferromagnetic layer functions to pin the magnetization direction of the magnetization fixed layer 12B. As the antiferromagnetic layer is exchange-coupled to the magnetization fixed layer, it is possible to give a one-direction anisotropy in the magnetization direction of the magnetization fixed layer. In this case, the magnetization fixed layer having a high coercive field in one direction can be obtained in comparison to a case where the antiferromagnetic layer is not provided. A material used for the antiferromagnetic layer is selected to match the material used for the magnetization fixed layer. For example, the antiferromagnetic layer can be made of an alloy that shows the antiferromagneticity through the use of Mn, and specifically, an alloy that includes at least one element selected from a group consisting of Mn, Pt, Ir, Fe, Ru, Cr, Pd, and Ni. Specifically, for example, the antiferromagnetic layer can be made of IrMn, PtMn, or the like.

Hereinafter, although the present invention will be described in more detail based on example 1, the present invention is not limited thereto.

Example 1

An SOI substrate composed of a silicon substrate, a silicon oxide layer (with a thickness of 200 nm), and a silicon layer (with a thickness of 100 nm) was prepared. An ion injection for giving the n-type conductivity to the silicon layer was performed. Then, impurities were diffused by annealing. The annealing temperature was 900° C. Thereafter, by cleaning, the adhered material, the organic material, and the oxide layer on the surface of the silicon layer, and the mask were removed. HF (Hydrofluoric acid) was used as a cleaning solution.

Then, a magnesium oxide layer (with a thickness of 0.8 nm) was formed on the silicon layer by an ultra-high vacuum E-beam evaporation method. Further, on the magnesium oxide layer, an iron layer (with a thickness of 10 nm) and a titanium layer were formed in order by an MBE method, and then the substrate was cleaned. In this case, the titanium layer was a cap layer for suppressing the characteristic deterioration due to the oxidation of the iron layer that was the magnetization fixed layer. Since the titanium layer is amorphous, it exerted a little influence upon the crystallization of the iron layer.

Then, an alignment mark was prepared by photolithography. Further, the magnesium oxide layer, the iron layer, and the titanium layer were patterned by ion milling. The silicon layer was patterned by anisotropy wet etching using an aluminum oxide layer, the magnesium oxide layer, the iron layer, the titanium layer, and resist as a mask.

In this case, the size of the silicon channel was 23 μm×300 μm. Also, by oxidizing the side surface of the obtained silicon channel, a silicon oxide layer was formed as the insulating layer.

Thereafter, the magnetization fixed layer and the magnetization free layer were obtained by patterning the iron layer by ion milling and chemical etching. Then, the magnesium oxide layer in a position except for a position between the magnetization fixed layer and the magnetization free layer and the silicon channel was removed. Accordingly, the first insulating layer and the second insulating layer were obtained. The first electrode and the second electrode were obtained by fowling an Al layer on the outer side of the magnetization fixed layer and the outer side of the magnetization free layer of the exposed silicon channel.

Further, as an insulating layer a silicon oxide layer was formed on the side surfaces of the silicon oxide layer on the side wall of the silicon channel, the first insulating layer, the second insulating layer, the magnetization fixed layer, the magnetization free layer, the first electrode, the second electrode, and portions of the upper surface of the silicon channel, on which the magnetization fixed layer, the magnetization free layer, the first electrode, and the second electrode were not formed.

Next, wirings 13 and 14 as illustrated in FIG. 1 were formed on the first electrode and the second electrode, respectively. As the wirings 13 and 14, a CuAu alloy (with a thickness of 50 nm) was used. Then, SiOx was formed with a thickness of 100 nm on the substrate for the insulation between the wirings. Thereafter, wirings 18 and 19 as illustrated in FIG. 1 were formed on the magnetization fixed layer 12B and the magnetization free layer 12C. As the horizontal portions 18a and 19a of the wirings 18 and 19, an CuAu alloy with a thickness of 50 nm in the Z direction was used, and as the vertical portions 18b and 19b thereof, a CuAu alloy with a thickness of 200 nm in the Z direction was used. Further as a protection layer, SiOx was formed on the substrate with a thickness of 100 nm, and then the respective electrode pads were formed at end portions of the respective wirings. As the electrode pads, a laminated structure of Cr (with a thickness of 50 nm) and Au (with a thickness of 150 nm) was used. By doing this, the spin transport device according to example 1, which has the same configuration as the spin transport device 100 as illustrated in FIG. 1, was prepared.

Comparative Example 1

In the comparative example, a spin transport device was prepared by the same method as in example 1, except for the structure in which the horizontal portions were put on the end portions of the magnetization fixed layer and the magnetization free layer in the X direction without providing the vertical portions, as wirings.

(Evaluation of an Output Voltage)

With respect to the spin transport devices made in example 1 and the comparative example 1, an external magnetic field was applied in the X direction, and the corresponding output voltage was measured. Specifically, by making current for detection from a current source flow to the magnetization fixed layer, spin was injected from the magnetization fixed layer into the silicon channel layer. Also, a voltage output based on the magnetization change of the magnetization free layer due to the external magnetic field was measured by the voltmeter.

Figure 5:
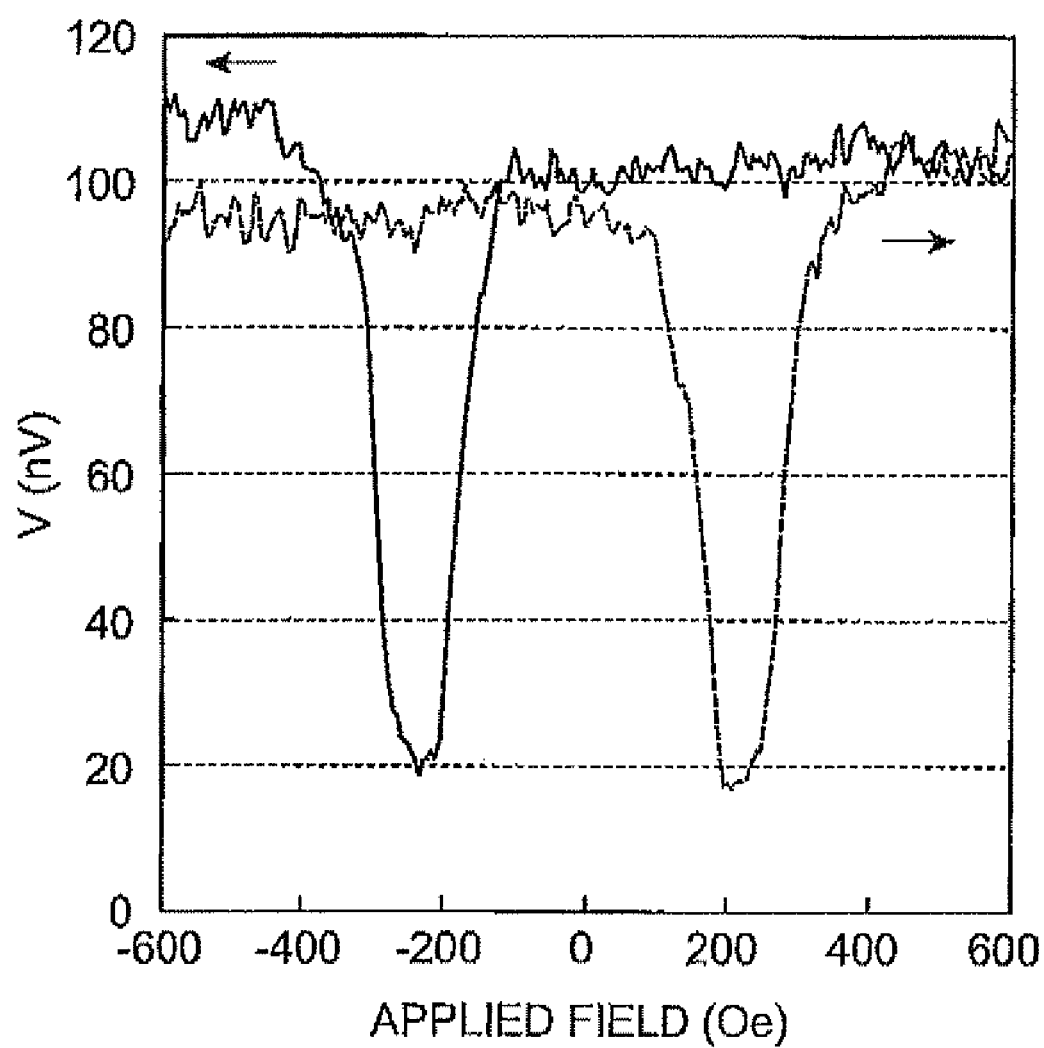
FIG. 5 is a graph illustrating the relation between the intensity [Oe] of an applied magnetic field and a voltage output [nV] in a spin transport device according to example 1.
Figure 6:
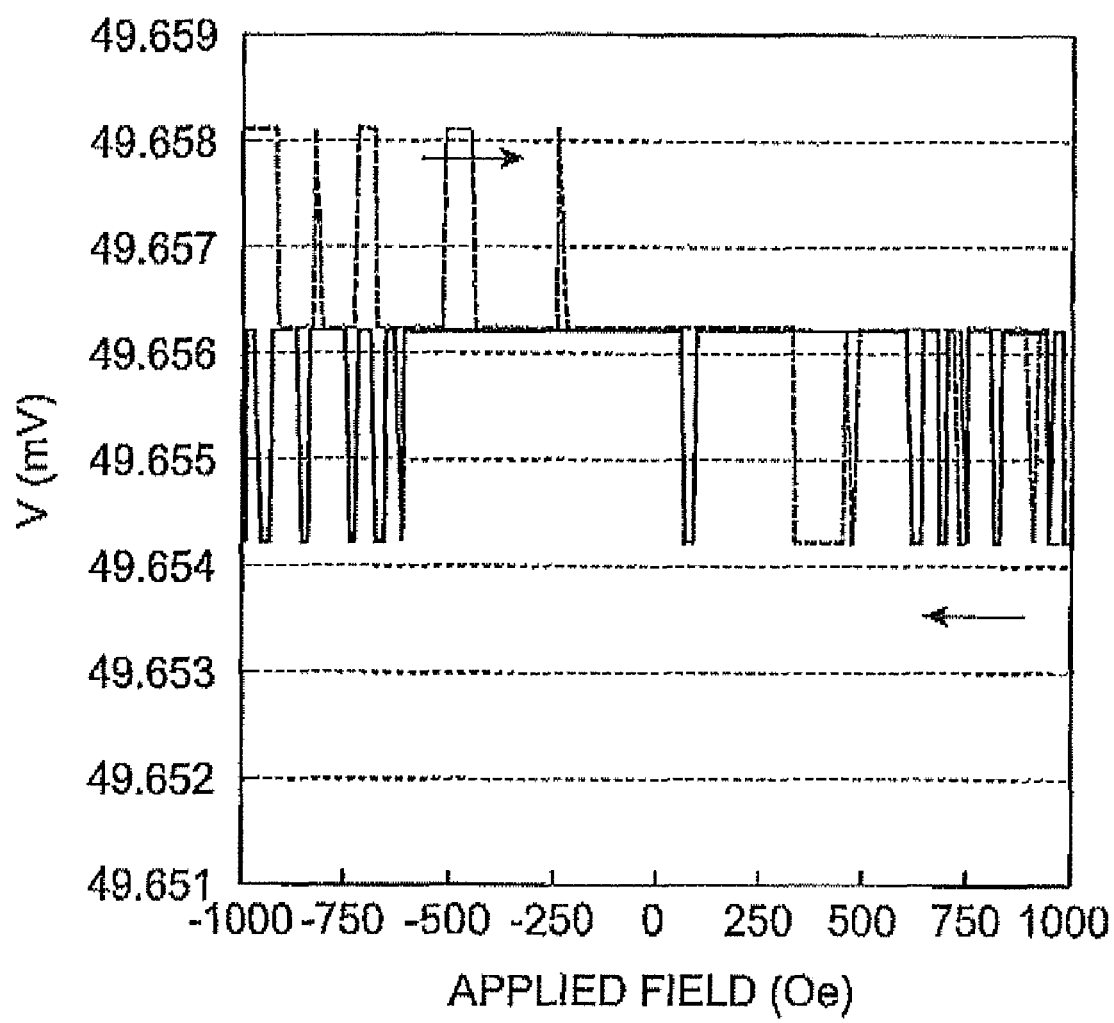
FIG. 6 is a graph illustrating the relation between the intensity [Oe] of an applied magnetic field and the voltage output [mV] in a spin transport device according to comparative example 1.

The result in example 1 is illustrated in FIG. 5, and the result in comparative example 1 is illustrated in FIG. 6. FIGS. 5 and 6 are graphs illustrating the relation between the intensity [Oe] of an applied magnetic field and a voltage output ([nV] in FIG. 5, and [mV] in FIG. 6). A dotted line indicates a case in which the applied magnetic field has been increased from a negative value to a positive value, and a solid line indicates a case in which the applied magnetic field has been decreased from a positive value to a negative value.

As illustrated in FIG. 5, according to the spin transport device of the example 1, a small noise occurred, and signal outputs according to the magnetization reversal of the magnetization free layer and the magnetization reversal of the magnetization fixed layer were appropriately obtained. By contrast, according to the spin transport device of the comparative example 1, the noise was about 1000 times greater, and signal outputs according to the magnetization reversal of the magnetization free layer and the magnetization reversal of the magnetization fixed layer were not clearly obtained.

What is claimed is:

1. A spin transport device comprising:
    a channel made of a semiconductor material;
    a magnetization fixed layer arranged on the channel via a first insulating layer;
    a magnetization free layer arranged on the channel via a second insulating layer;
    a first wiring electrically connected to the magnetization fixed layer; and
    a second wiring electrically connected to the magnetization free layer;
    wherein the spin transport device satisfies at least one of following condition A and condition B,
    Condition A: The first wiring includes a vertical portion which extends in a thickness direction of the magnetization fixed layer on the magnetization fixed layer, and a horizontal portion connected to the vertical portion by an end of the horizontal portion, the horizontal portion extending from the vertical portion in a direction crossing the thickness direction of the magnetization fixed layer and having a thickness smaller than a thickness of the vertical portion in the thickness direction of the magnetization fixed layer, and
    Condition B: The second wiring includes a vertical portion which extends in a thickness direction of the magnetization free layer on the magnetization free layer, and a horizontal portion connected to the vertical portion by an end of the horizontal portion, the horizontal portion extending from the vertical portion in a direction crossing the thickness direction of the magnetization free layer and having a thickness smaller than a thickness of the vertical portion in the thickness direction of the magnetization free layer.

2. The spin transport device according to claim 1, wherein both the condition A and the condition B are satisfied.

3. The spin transport device according to claim 1, further comprising a first electrode and a second electrode arranged on the channel;
    wherein the channel extends in a predetermined direction; and
    the first electrode, the magnetization fixed layer, the magnetization free layer, and the second electrode are arranged on the channel in order along the predetermined direction.

4. The spin transport device according to claim 1, further comprising an insulating layer that covers the channel.

5. The spin transport device according to claim 1, wherein the first insulating layer and the second insulating layer are made of magnesium oxide.

6. The spin transport device according to claim 1, wherein a material of the magnetization free layer and the magnetization fixed layer includes a metal selected from a group consisting of Ti, V, Cr, Mn, Co, Fe, and Ni, an alloy including one or more elements of the group, or an alloy including one or more elements selected from the group and one or more elements selected from a group consisting of B, C, and N.

7. The spin transport device according to claim 1, wherein the magnetization free layer and the magnetization fixed layer have a difference in coercive field by shape anisotropy.

8. The spin transport device according to claim 1, further comprising an antiferromagnetic layer between the magnetization fixed layer and the first wiring;
    wherein the antiferromagnetic layer pins the magnetization direction of the magnetization fixed layer.

* * * * *